United States Patent
Iwasaki et al.

(10) Patent No.: US 11,621,140 B2
(45) Date of Patent: Apr. 4, 2023

(54) MULTIPLE ELECTRON BEAM WRITING APPARATUS AND MULTIPLE ELECTRON BEAM WRITING METHOD

(71) Applicant: NuFlare Technology, Inc., Yokohama (JP)

(72) Inventors: Kota Iwasaki, Atsugi (JP); Taku Yamada, Ayase (JP)

(73) Assignee: NuFlare Technology, Inc., Yokohama (JP)

( * ) Notice: Subject to any disclaimer, the term of this patent is extended or adjusted under 35 U.S.C. 154(b) by 120 days.

(21) Appl. No.: 17/305,607

(22) Filed: Jul. 12, 2021

(65) Prior Publication Data

US 2022/0059310 A1 Feb. 24, 2022

(30) Foreign Application Priority Data

Aug. 21, 2020 (JP) .............................. JP2020-139823

(51) Int. Cl.
*H01J 37/317* (2006.01)
*H01J 37/04* (2006.01)
(Continued)

(52) U.S. Cl.
CPC ............ *H01J 37/045* (2013.01); *H01J 37/10* (2013.01); *H01J 37/24* (2013.01); *H01J 37/3177* (2013.01); *H01J 2237/0435* (2013.01)

(58) Field of Classification Search
CPC .......... H01J 37/045; H01J 37/10; H01J 37/24; H01J 37/3177; H01J 2237/0435
See application file for complete search history.

(56) References Cited

U.S. PATENT DOCUMENTS

| 5,463,200 A * | 10/1995 | James | ................ B23K 26/0738 219/121.75 |
| 2003/0042434 A1* | 3/2003 | Mankos | .............. G03F 7/70375 250/492.24 |

(Continued)

FOREIGN PATENT DOCUMENTS

| JP | 2003-511855 A | 3/2003 |
| JP | 2005-533365 A | 11/2005 |

(Continued)

*Primary Examiner* — Sean M Luck
(74) *Attorney, Agent, or Firm* — Oblon, McClelland, Maier & Neustadt, L.L.P.

(57) ABSTRACT

A multiple electron beam writing apparatus includes an excitation light source to emit an excitation light, a multi-lens array to divide the excitation light into a plurality of lights, a photoemissive surface to receive the plurality of lights incident through its upper side, and emit multiple photoelectron beams from its back side, a blanking aperture array mechanism to provide, by deflecting each beam of the multiple photoelectron beams, an individual blanking control which individually switches each beam between ON and OFF, an electron optical system to include an electron lens, and to irradiate, using the electron lens, a target object with the multiple photoelectron beams having been controlled to be beam ON, and a control circuit to interconnect, for each shot of the multiple photoelectron beams, a timing of switching the excitation light between emission and non-emission with a timing of switching the each beam between ON and OFF.

11 Claims, 9 Drawing Sheets

(51) Int. Cl.
*H01J 37/10* (2006.01)
*H01J 37/24* (2006.01)

(56) References Cited

U.S. PATENT DOCUMENTS

| | | | | |
|---|---|---|---|---|
| 2003/0048427 A1* | 3/2003 | Fernandez | ......... | G03F 7/70375 |
| | | | | 355/53 |
| 2003/0122091 A1* | 7/2003 | Almogy | .............. | H01J 37/3177 |
| | | | | 250/492.24 |
| 2004/0069960 A1* | 4/2004 | Maldonado | ............ | B82Y 40/00 |
| | | | | 250/492.24 |
| 2004/0090194 A1* | 5/2004 | Gesley | ................... | B82Y 10/00 |
| | | | | 315/506 |
| 2004/0140432 A1* | 7/2004 | Maldonado | ............ | B82Y 40/00 |
| | | | | 250/423 P |
| 2016/0358743 A1* | 12/2016 | Pan | ..................... | H01J 37/3177 |

FOREIGN PATENT DOCUMENTS

| | | |
|---|---|---|
| JP | 2011-181416 A | 9/2011 |
| WO | WO 01/26134 A1 | 4/2001 |
| WO | WO 03/040829 A2 | 5/2003 |

\* cited by examiner

MULTIPLE ELECTRON BEAM WRITING APPARATUS AND MULTIPLE ELECTRON BEAM WRITING METHOD

CROSS-REFERENCE TO RELATED APPLICATION

This application is based upon and claims the benefit of priority from prior Japanese Patent Application No. 20-139823 filed on Aug. 21, 20 in Japan, the entire contents of which are incorporated herein by reference.

BACKGROUND OF THE INVENTION

Field of the Invention

An embodiment of the present invention relates to a multiple electron beam writing apparatus and a multiple electron beam writing method.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique which intrinsically has excellent resolution is used for writing or "drawing" a mask pattern on a mask blank with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a shaping aperture array substrate, performs blanking control for each beam, reduces, by an optical system, each beam which was not blocked by a limiting aperture in order to reduce a mask image, and deflects the beam by a deflector to irradiate a desired position on a target object or "sample".

In multi-beam writing, the amount of dose of each beam is controlled based on an irradiation time. The irradiation time of each beam is controlled by a blanking mechanism. However, even when controlled to be in a "beam OFF" state by the blanking mechanism, blocking by the limiting aperture cannot be achieved completely, which may generate a leaked beam. If a leaked beam is generated, the resist on the target object is exposed to light, thereby causing a problem of affecting the writing accuracy. Therefore, it is required to suppress or reduce leaked beams.

There is disclosed a method for generating multiple electron beams by receiving laser beam irradiation incident through the upper side of a photoemissive surface and emitting electrons from a plurality of exposed surfaces restricted by the gate insulator disposed at the back side serving as a mask (refer to, e.g., Japanese Translation of PCT International Application Publication No. 2003-511855). According to this method, controlling to be in a "beam OFF" state is achieved by returning electrons emitted by the electric field between the gate electrode on the gate insulator and the photoemissive surface to the exposed surface. However, even in this method, a leaked beam may be generated because of not completely returning the electrons to the exposed surface, thereby possibly producing the same problem.

BRIEF SUMMARY OF THE INVENTION

According to one aspect of the present invention, a multiple electron beam writing apparatus includes an excitation light source configured to emit an excitation light; a multi-lens array configured to divide the excitation light into a plurality of lights; a photoemissive surface configured on the multi-lens array to receive the plurality of lights incident through its upper side, and emit multiple photoelectron beams from its back side; a blanking aperture array mechanism configured to provide, by deflecting each beam of the multiple photoelectron beams, an individual blanking control which individually switches the each beam between ON and OFF; an electron optical system configured to include an electron lens, and to irradiate, using the electron lens, a target object with the multiple photoelectron beams having been controlled to be beam ON; and a control circuit configured to interconnect, for each shot of the multiple photoelectron beams, a timing of switching the excitation light between emission and non-emission with a timing of switching the each beam between ON and OFF.

According to another aspect of the present invention, a multiple electron beam writing method includes emitting an excitation light from an excitation light source; dividing the excitation light into a plurality of lights by using a multi-lens array; receiving the plurality of lights incident through an upper side of a photoemissive surface, and emitting multiple photoelectron beams from its back side; providing, for each shot of the multiple photoelectron beams, an individual blanking control which individually switches each beam of the multiple photoelectron beams between ON and OFF using a blanking aperture array mechanism while interconnecting a timing of switching the excitation light between emission and non-emission with a timing of switching the each beam between ON and OFF; and writing a pattern on a target object, using the multiple photoelectron beams having been controlled to be ON.

DETAILED DESCRIPTION OF THE INVENTION

Embodiments of the present invention provide an apparatus and a method that can, in multiple beam writing, reduce leaked beams and improve writing accuracy.

First Embodiment

Figure 1:
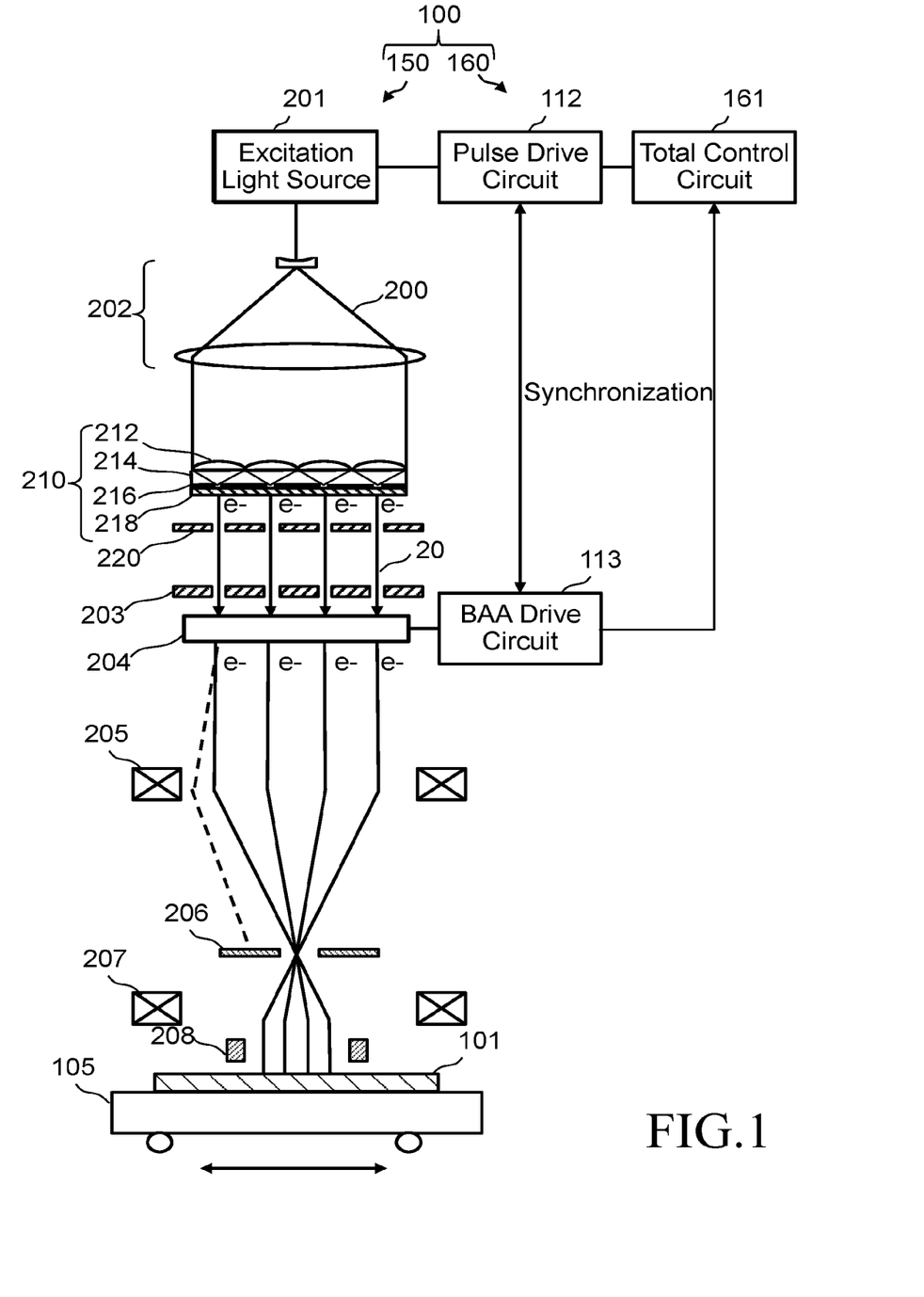
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control circuit 160. The writing apparatus 100 is an example of a multiple charged particle beam writing apparatus. In the electron optical column (electron beam column) (not shown) inside the writing mechanism 150, there are arranged, in this order: an excitation light source 201, a beam expander 202, a photoelectron emission mechanism 210, a multi-anode electrode 220, a shaping aperture array substrate 203, a blanking aperture array mechanism 204, an electron lens 205, a limiting aperture substrate 206, an electron lens 207 (objective lens), and an objective deflector 208. In the chamber (not shown) arranged below the electron optical column (not shown), an XY stage 105 is disposed. On the XY stage 105, there is placed a target object or "sample" 101 such as a resist-coated mask blank serving as a writing target substrate when writing is performed. The target object 101 is, for example, an exposure mask used when fabricating semiconductor devices, or a semiconductor substrate (silicon wafer) for fabricating semiconductor devices. The insides of the electron optical column and the writing chamber, at the downstream side of the photoelectron emission mechanism 210, are evacuated by a vacuum pump (not shown) to be controlled in a pressure lower than the atmospheric pressure.

In the photoelectron emission mechanism 210, a multi-lens array 212 is disposed on a glass substrate 214. A multiple light shielding layer 216 serving as a light shielding mask, and a photoemissive surface 218 (an example of a photoemitter) are disposed on the back side of the glass substrate 214. The beam expander 202 is composed of a combination of a concave lens and a convex lens.

The control circuit 160 includes a pulse drive circuit 112, a blanking aperture array (BAA) drive circuit 113, and a total control circuit 161. The pulse drive circuit 112, the blanking aperture array (BAA) drive circuit 113, and the total control circuit 161 are mutually connected through a bus (not shown).

FIG. 1 shows configuration elements necessary for describing the first embodiment. It should be understood that other configuration elements generally necessary for the inspection apparatus 100 may also be included therein.

Next, operations of the writing mechanism 150 will be described. The pulse drive circuit 112 drives the excitation light source 201 under the control of the total control circuit 161 which controls the entire writing apparatus 100. The excitation light source 201 emits (generates) an excitation light 200 having a predetermined beam diameter. The excitation light 200 includes a pulse wave. The excitation light source 201 emits an ultraviolet light as the excitation light 200. It is preferable to use an ultraviolet light or a visible light having a wavelength of, for example, about 190 to 400 nm as the excitation light 200. It is preferable to use a laser light having a wavelength of, for example, 266 nm.

The excitation light 200 emitted from the excitation light source 201 is expanded by the beam expander 202 and turns into a parallel light, for example, to illuminate the multi-lens array 212. The multi-lens array 212 divides the excitation light 200 into a plurality of lights. The multi-lens array 212 is composed of lens arrays in which individual lenses whose number is greater than or equal to that of beams configuring multiple photoelectron beams 20 are arrayed. For example, it is composed of 512×512 lenses. The multi-lens array 212 individually collects (condenses) the divided plurality of lights, and aligns the focus position of each light with the height position of the surface of the photoemissive surface 218. The effective brightness (luminance) of each light can be enhanced because light collection is performed by the multi-lens array 212.

A plurality of openings are formed in the multiple light shielding layer 216 so that the region of the irradiation spot of each of the plurality of lights (multiple lights) having been divided and collected may be exposed. Thereby, lights which passed through the glass substrate 214 without being collected by the multi-lens array 212 and/or scattered lights can be blocked by portions other than the openings. Preferably, a chromium (Cr) film, for example, is used as the multiple light shielding layer 216.

Each of the lights having passed through the multiple light shielding layer 216 is incident on the upper side of the photoemissive surface 218. The photoemissive surface 218 receives a plurality of lights incident through its upper side, and emits the multiple photoelectron beams 20 from its back side. For example, 512×512 arrayed photoelectron beams are emitted in the x and y directions. Specifically, the photoemissive surface 218 receives a plurality of lights at the front surface, and emits photoelectrons from respective positions on the backside corresponding to incident positions. The photoemissive surface 218 is preferably formed by a film whose main material is a platinum-based material, such as platinum (Pt) and ruthenium (Ru). It is also preferable to use a film of a carbon (C)-based material as the main material. Moreover, the photoemissive surface 218 may also be made of an NEA semiconductor or alkali metal. If the upper side of the photoemissive surface 218 is irradiated with photons having energy greater than a work function of material of the photoemissive surface 218, photoelectrons are emitted from its back side. In order to acquire the multiple photoelectron beams 20 of sufficient current density to be used in the inspection apparatus 100, it is preferable that a light of, for example, about 0.1 to 100000 W/cm$^2$ (about $10^3$ to $10^9$ W/m$^2$) enters the upper side of the photoemissive surface 218.

The multiple photoelectron beams 20 emitted from the photoemissive surface 218 is accelerated by being applied with relatively positive electric potential and being drawn by the multi-anode electrode 220 in which openings are arranged at the same pitch as the irradiation spot of the multi-lens array 212, and then proceeds toward the shaping aperture array substrate 203.

Figure 2:
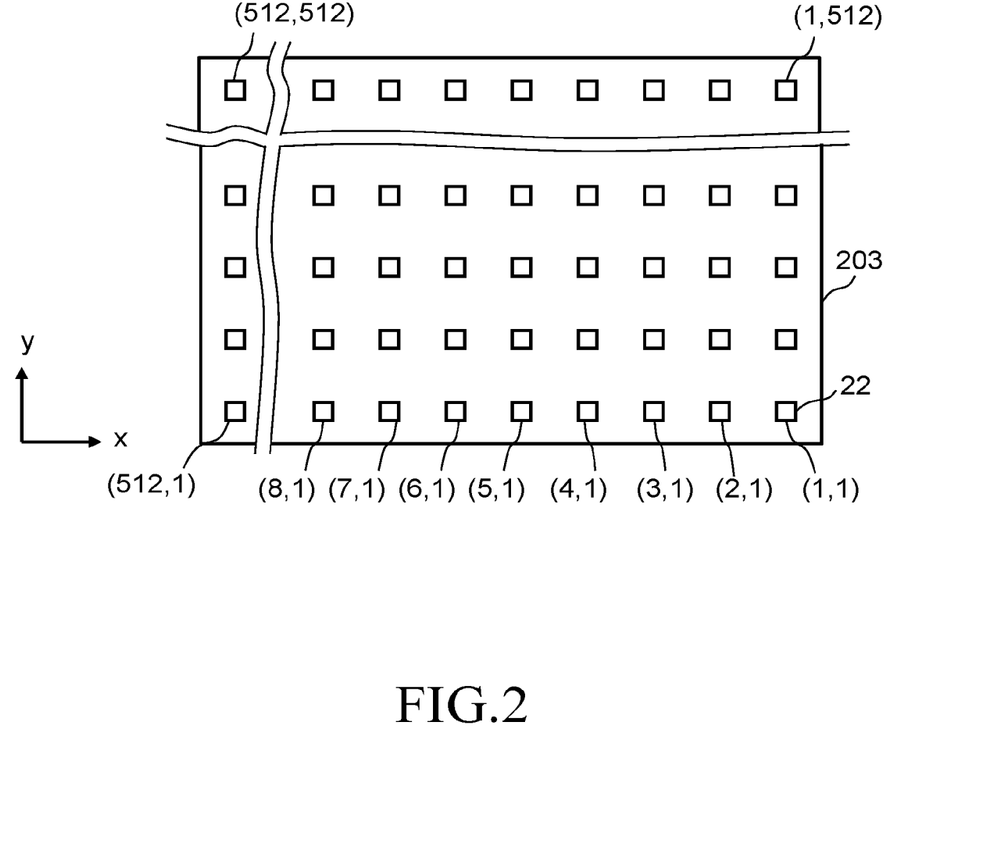
FIG. 2 is a conceptual diagram showing a configuration of a shaping aperture array substrates according to the first embodiment.

FIG. 2 is a conceptual diagram showing a configuration of a shaping aperture array substrates according to the first embodiment. As shown in FIG. 2, holes (openings) 22 of p rows long and q columns wide (p≥2, q≥2) are formed in the x and y directions, like a matrix, at a predetermined arrangement pitch in the shaping aperture array substrate 203. In the case of FIG. 2, for example, holes 22 of 512 (rows)×512 (columns) are formed in the x and y directions. Each of the plurality of holes 22 is formed to be individually on each of the trajectories of the multiple photoelectron beams 20 emitted from the photoemissive surface 218. Each photoelectron beam is not necessarily emitted in a uniform shape and size from the photoemissive surface 218. For example, it expands in the diffusion direction. Therefore, the shape and size of each photoelectron beam is shaped by the shaping aperture array substrate 203. In FIG. 2, each of the holes 22 is rectangular, including square, having the same dimension and shape as each other. Alternatively, each of the holes 22 may be a circle with the same diameter as each other. The shaping aperture array substrate 203 forms the multiple photoelectron beams 20 to be used for writing. Specifically, the multiple photoelectron beams 20 are shaped in a desired shape and size by letting portions of emitted multiple photoelectron beams individually pass through a corresponding one of the plurality of holes. If diffusion of each photoelectron beam emitted from the photoemissive surface 218 is small, the shaping aperture array substrate 203 may be omitted.

Figure 3:
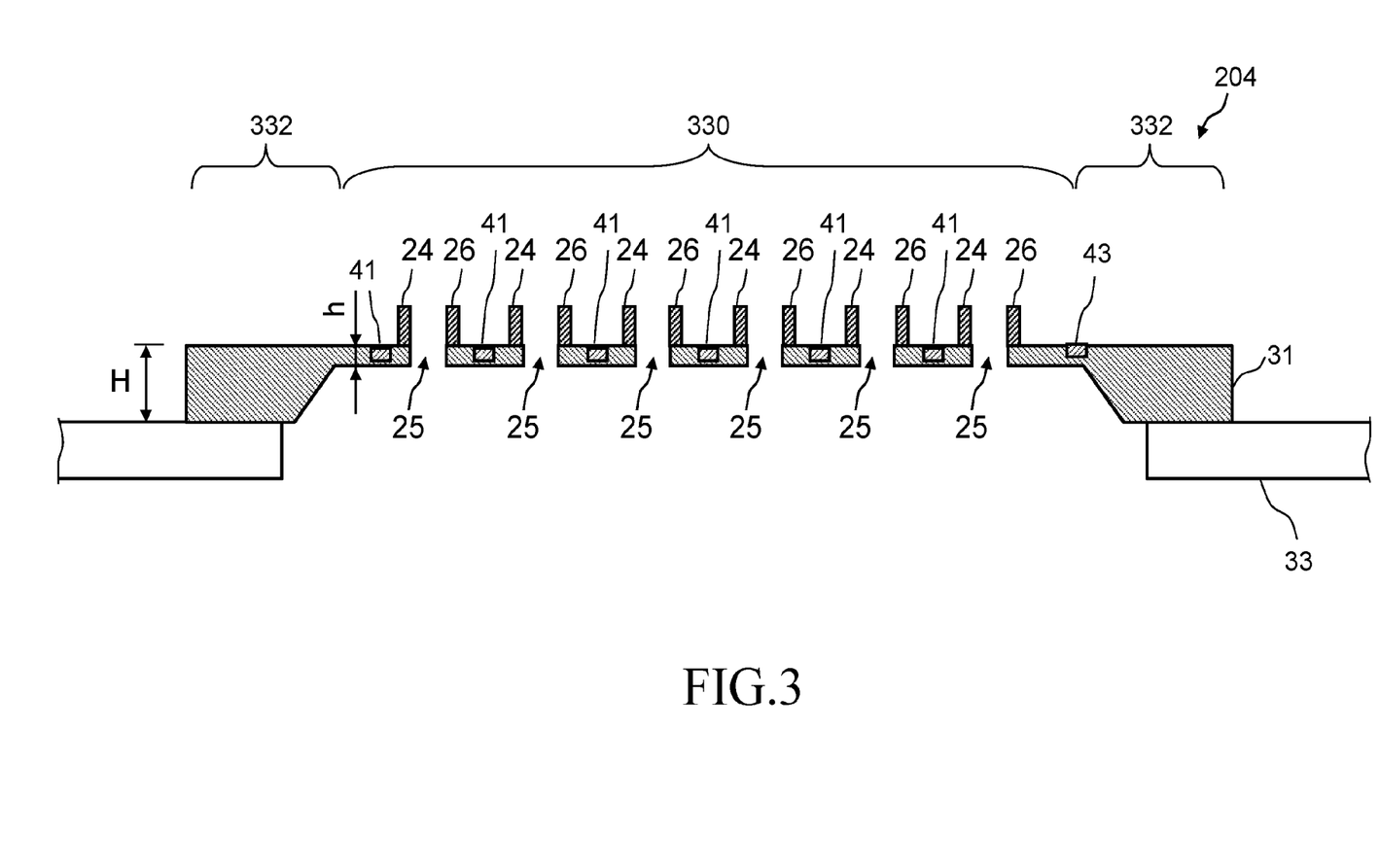
FIG. 3 is a sectional view showing a configuration of a blanking aperture array mechanism according to the first embodiment.

FIG. 3 is a sectional view showing a configuration of a blanking aperture array mechanism according to the first embodiment. With regard to the structure of the blanking aperture array mechanism 204, a semiconductor substrate 31 made of silicon, etc. is placed on a support table 33 as shown in FIG. 3. The central part of the substrate 31 is shaved, for example, from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple photoelectron beams 20 passes are formed at positions each corresponding to each hole 22 in the shaping aperture array substrate 203 shown in FIG. 2. In other words, in the membrane region 330 of the substrate 31, there are formed a plurality of passage holes 25 in an array through each of which a corresponding one of the multiple photoelectron beams 20 passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIG. 3, each pair (blanker: blanking deflector) of a control electrode 24 and a counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 of the substrate 31, there is arranged a logic circuit 41 which applies a deflection voltage to the control electrode 24 for the passage hole 25 concerned. The counter electrode 26 for each beam is grounded.

To each logic circuit 41, n-bit (e.g., 10-bit) parallel lines for control signals are connected. In addition to the n-bit parallel lines for controlling signals, lines for a clock signal, a read signal, a shot signal, a power supply, and the like are connected to each logic circuit 41. An individual blanking control mechanism composed of the control electrode 24, the counter electrode 26, and the logic circuit 41 is configured for each of the multiple beams. A plurality of logic circuits 41 formed in an array in the membrane region 330 are grouped, for example, per row or per column, and the logic circuits 41 in each group are connected in series. Then, a pad 43 arranged for each group sends a signal to the logic circuits 41 in the group concerned. Specifically, a shift register (not shown) is arranged in each logic circuit 41, and shift registers in the logic circuits 41 for beams in the same row, for example, in p×q, for example, multiple beams are connected in series. For example, control signals for beams in the same row in the p×q multiple beams are transmitted in series, and, a control signal for each beam is stored in a corresponding logic circuit 41 by p clock signals totally, for example.

In the logic circuit 41, an amplifier (not shown) (an example of a switching circuit) is arranged. The amplifier is connected to a positive potential (Vdd: blanking potential: first electric potential) (e.g., 5 V) and to a ground potential (GND: second electric potential). The output line (OUT) of the amplifier is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that each control electrode 24 and the corresponding counter electrode 26 are opposite to each other with respect to a corresponding one of a plurality of passage holes 25.

In a state where an L electric potential is applied to the input (IN) of the amplifier, the output (OUT) of the amplifier becomes a positive potential (Vdd), and then, a corresponding beam is deflected by an electric field due to a potential difference from the ground potential of the counter electrode 26 so as to be blocked by the limiting aperture substrate 206, and thus it is controlled to be in a beam OFF condition. By contrast, in a state (active state) where an H electric potential is applied to the input (IN) of the amplifier, the output (OUT) of the amplifier becomes a ground potential, and therefore, since there is no potential difference from the ground potential of the counter electrode 26, a corresponding beam is not deflected, and thus, by making the beam concerned pass through the limiting aperture substrate 206, it is controlled to be in a beam ON condition.

The blanking aperture array mechanism 204 performs individual blanking control by deflecting each beam of the multiple photoelectron beams 20 in order to individually switch each beam between ON and OFF states. In individual blanking control, each of the multiple photoelectron beams 20 passing through a corresponding passage hole is deflected by a voltage independently applied to a pair of the control electrode 24 and the counter electrode 26. Blanking control is provided by this deflection. Specifically, a pair of the control electrode 24 and the counter electrode 26 individually provides blanking deflection of a corresponding beam of the multiple photoelectron beams 20 by an electric potential switchable by the amplifier serving as a switching circuit corresponding to each pair. Thus, each of a plurality of blankers provides blanking deflection of a corresponding one of the multiple photoelectron beams 20 having passed through a plurality of holes 22 (openings) in the shaping aperture array substrate 203.

The multiple photoelectron beams 20 having passed through the blanking aperture array mechanism 204 are reduced by the electron lens 205, and go toward the hole in the center of the limiting aperture substrate 206 disposed close to a crossover position. An electron beam in the multiple photoelectron beams 20 which was deflected by the blanker of the blanking aperture array mechanism 204 deviates (shifts) from the hole in the center of the limiting aperture substrate 206, and is blocked by the limiting aperture substrate 206 (that is, beam OFF). On the other hand, an electron beam which was not deflected by the blanker of the blanking aperture array mechanism 204 passes through the hole in the center of the limiting aperture substrate 206 as shown in FIG. 1 (that is, beam ON). Blanking control is provided by ON/OFF of the individual blanking control mechanism, and thus ON/OFF of each beam is controlled. Thereby, for each beam, one shot beam is formed by a beam which has been made during a period from becoming beam ON to becoming beam OFF and has passed through the limiting aperture substrate 206. The target object 101 is irradiated with the multiple photoelectron beams 20 having been controlled to be in a "beam ON" state by the electron optical system. Specifically, the multiple photoelectron beams 20 having passed through the limiting aperture substrate 206 are focused by the electron lens 207 (objective lens) so as to be a pattern image of a desired reduction ratio. Then, all of the multiple photoelectron beams 20 controlled in a "beam ON" state are collectively deflected in the same direction by the objective deflector 208 to irradiate respective beam irradiation positions on the target object 101. Ideally, the multiple photoelectron beams 20 irradiating at a time are aligned at the pitch obtained by multiplying the arrangement pitch of a plurality of holes 22 in the shaping aperture array substrate 203 by the desired reduction ratio described above. The electron lens 205 and the electron lens 207 may be either an electrostatic lens or an electromagnetic lens.

Figure 4:
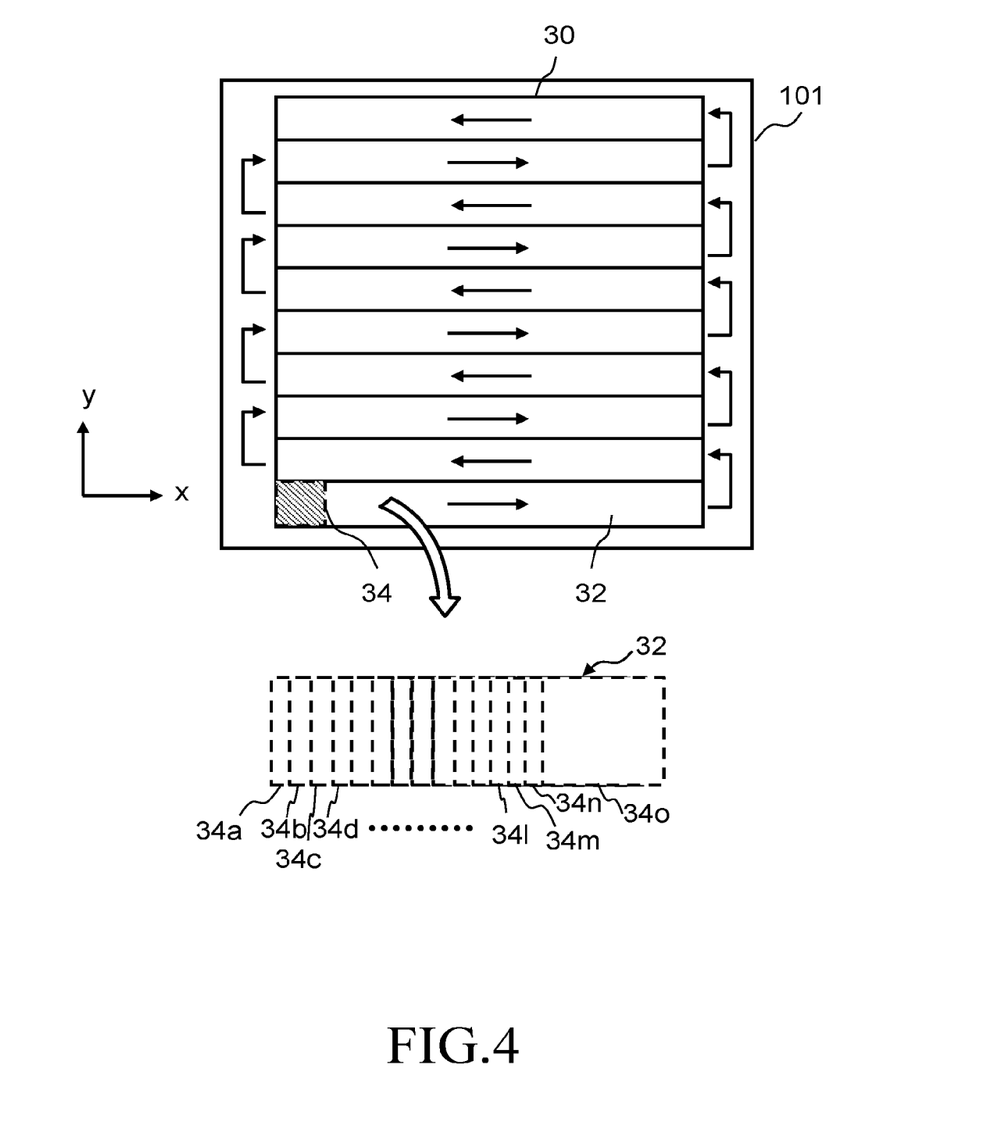
FIG. 4 is a conceptual diagram illustrating an example of a writing operation according to the first embodiment.

FIG. 4 is a conceptual diagram illustrating an example of a writing operation according to the first embodiment. As shown in FIG. 4, a writing region 30 of the target object 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple photoelectron beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203.

Figure 5:
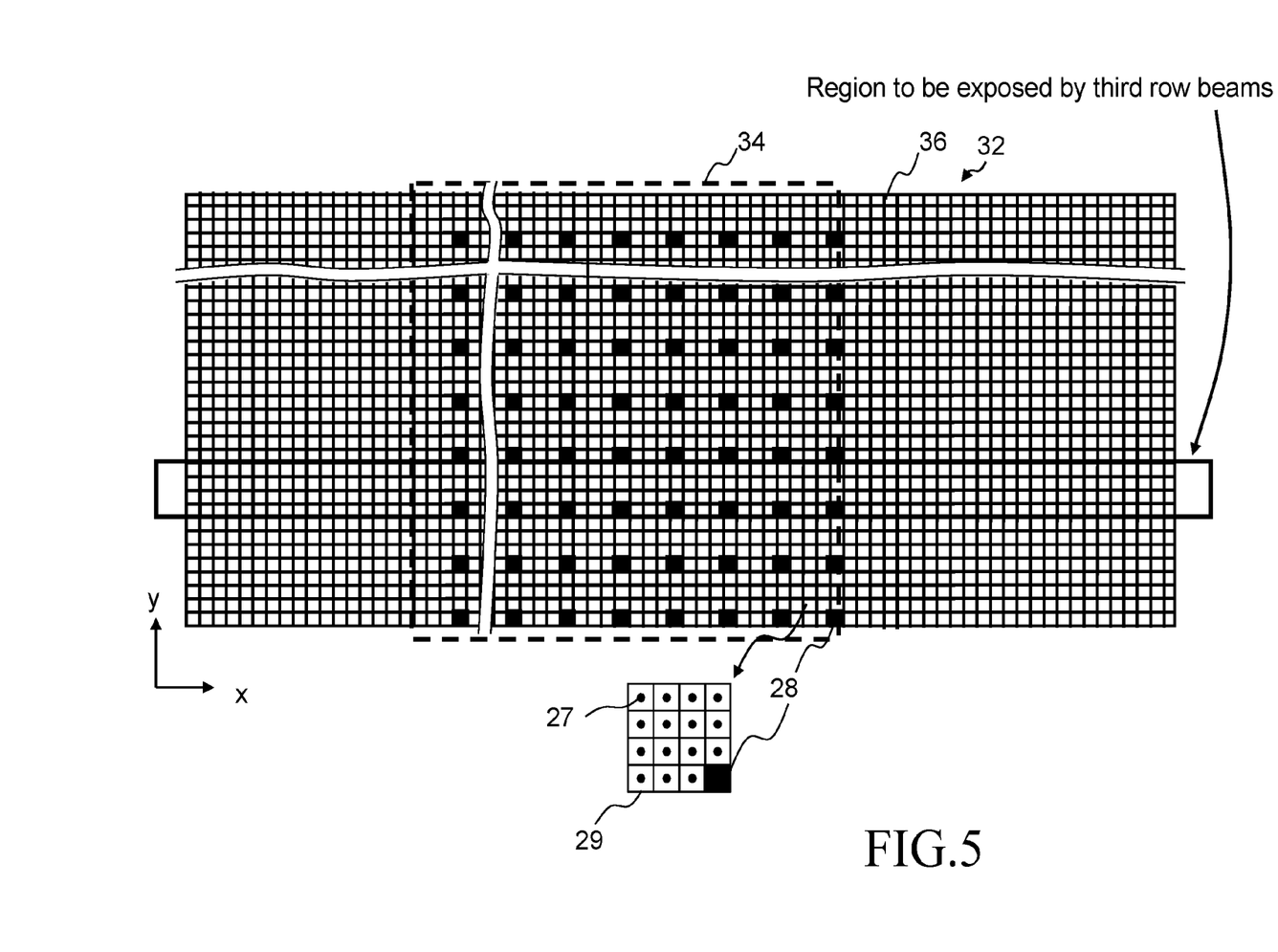
FIG. 5 shows an example of an irradiation region of multiple beams and a writing target pixel according to the first embodiment.

FIG. 5 shows an example of an irradiation region of multiple beams and a pixel to be written (writing target pixel) according to the first embodiment. In FIG. 5, in the stripe region 32, there are set a plurality of control grids 27 (design grids) arranged in a grid form at the beam size pitch of the multiple photoelectron beams 20 on the surface of the target object 101, for example. Preferably, they are arranged at a pitch of around 10 nm. The plurality of control grids 27 serve as design irradiation positions of the multiple photoelectron beams 20. The arrangement pitch of the control grid 27 is not limited to the beam size, and may be an arbitrary size which can be controlled as a deflection position of the objective deflector 208, regardless of the beam size. Then, a plurality of pixels 36 obtained by virtually dividing into a mesh form by the same size as that of the arrangement pitch of the control grid 27 are set, each of which is centering on each control grid 27. Each pixel 36 serves as an irradiation unit region per beam of the multiple photoelectron beams 20. FIG. 5 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple photoelectron beams 20. The x-direction size of the irradiation region 34 can be defined by the value obtained by multiplying the beam pitch (pitch between beams) in the x direction (first direction) of the multiple photoelectron beams 20 by the number of beams in the x direction. The y-direction size of the irradiation region 34 can be defined by the value obtained by multiplying the beam pitch in the y direction (second direction) of the multiple photoelectron beams 20 by the number of beams in the y direction. The width of the stripe region 32 is not limited to this. Preferably, the width of the stripe region 32 is n times (n being an integer of one or more) the size of the irradiation region 34. FIG. 5 shows the case where the multiple photoelectron beams 20 of 512×512 (rows×columns) are simplified to 8×8 (rows×columns). In the irradiation region 34, there are shown a plurality of pixels 28 (beam writing positions) which can be irradiated with one shot of the multiple photoelectron beams 20. In other words, the pitch between adjacent pixels 28 is the pitch between beams of the design multiple beams. In the example of FIG. 5, one sub-irradiation region 29 is a region surrounded by beam pitches. In the case of FIG. 5, each sub-irradiation region 29 is composed of 4×4 pixels.

Figure 6:
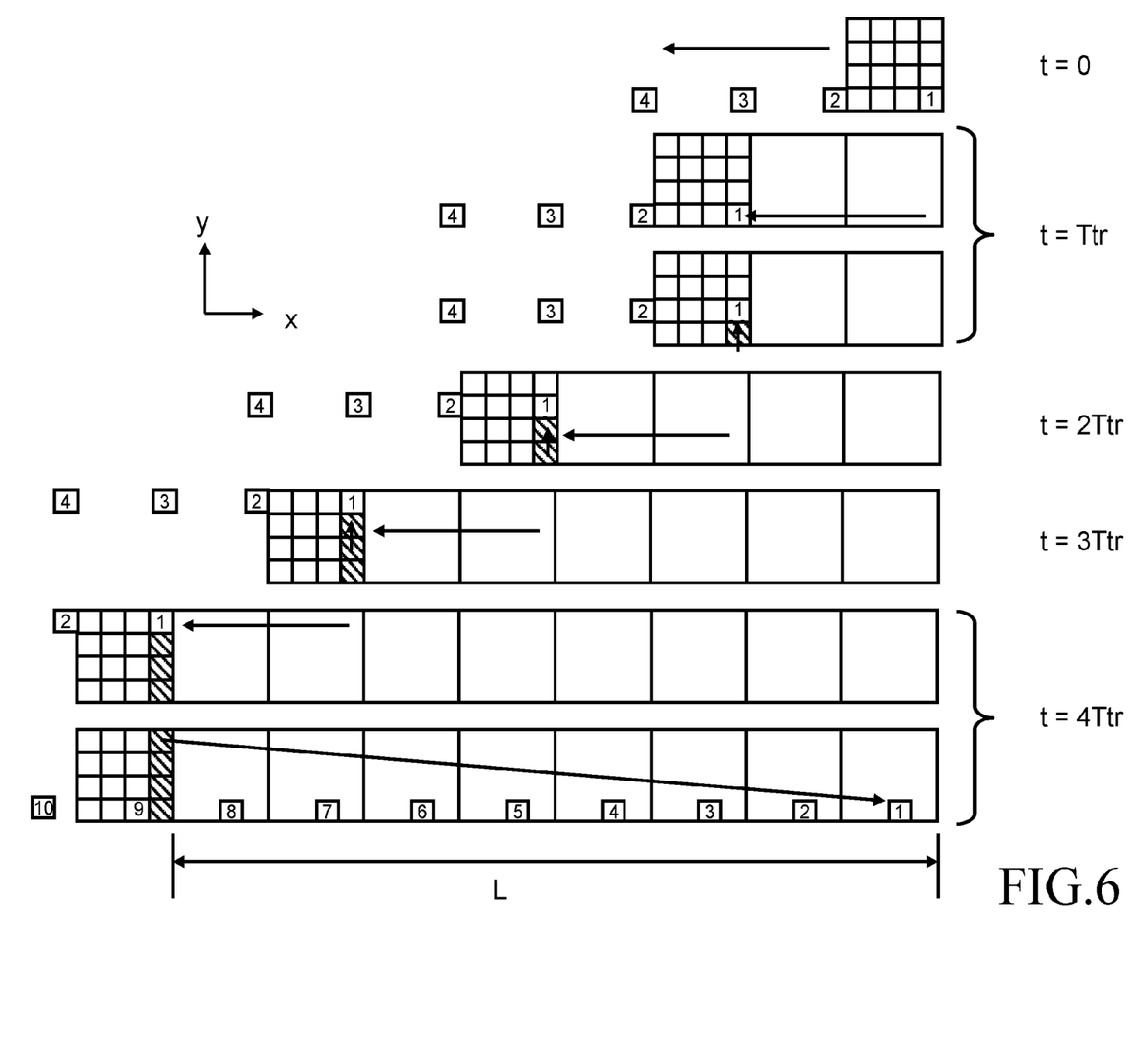
FIG. 6 illustrates an example of a writing method of multiple beams according to the first embodiment.

FIG. 6 illustrates an example of a writing method of multiple beams according to the first embodiment. FIG. 6 shows a portion of the sub-irradiation region 29 to be written by each beam. In the case of FIG. 6, while the XY stage 105 moves the distance of eight beam pitches, four pixels are written (exposed). At each shot, each pixel is irradiated with beams during a desired irradiation time controlled to be between 0 and the maximum irradiation time Ttr. The four pixels are written (exposed) during the time between t=0 and t=4Ttr. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple photoelectron beams 29 by the objective deflector 208. In other words, tracking control is performed. In the case of FIG. 6, one tracking cycle is executed by writing (exposing) four pixels while the target object 101 on the XY stage 105 moves the distance of eight beam pitches. After the four pixels have been irradiated with beams, the tracking position is returned to the start position of tracking, where the tracking control was started, by resetting the beam deflection for tracking control. In the example of FIG. 6, when the time becomes t=4Ttr, tracking of the sub-irradiation region 29 concerned is removed (cancelled), and the beam is swung back to a next target sub-irradiation region 29 shifted by eight beam pitches in the x direction. Although the beam (1) at the coordinates (1, 3) has been described in the example of FIG. 6, writing is also similarly performed for each sub-irradiation region 29 corresponding to a beam at other coordinates.

Since writing of the pixels in the first column from the right of each sub-irradiation region 29 has been completed, the deflector 209 performs, after resetting the tracking, in a next tracking cycle, deflection such that the writing position of each corresponding beam is adjusted (shifted) to the control grid 27 at the bottom in the second pixel column from the right of each sub-irradiation region 29. Thereby, by repetition of this operation, all of the pixels in each sub-irradiation region 29 are irradiated. By repeating this operation during writing the stripe region 32, the position of the irradiation region 34 is shifted one by one, such as from 34a to 34o as shown in FIG. 4, to perform writing of the stripe region concerned. In the case of FIG. 6, the sub-irradiation region 29 is composed of 4×4 pixels, but it is not limited thereto. When the sub-irradiation region 29 is composed of n×n pixels, n control grids (n pixels) are written by one tracking operation while the irradiation position is shifted. Thus, writing is performed for each n pixels by a different beam each time in n-time tracking operations, thereby writing all of pixels in one region of n×n pixels.

In multi-beam writing, the amount of dose of each beam is controlled based on an irradiation time. The irradiation time of each beam is controlled by the blanking aperture array mechanism 204. However, even when controlled to be in a "beam OFF" state by the blanking aperture array mechanism 204, blocking by the limiting aperture substrate 206 cannot be achieved completely, which may generate a leaked beam. If a leaked beam is generated, the resist on the target object 101 is exposed to light, thereby causing a problem of affecting the writing accuracy. Therefore, it is required to suppress or reduce leaked beams. With respect to, for example, a thermal cathode electron gun conventionally used as an electron beam source, it is difficult to turn on and off the emission (generation) of a beam of thermoelectrons during writing processing. Therefore, even when controlled to be in a "beam OFF" state by the blanking aperture array mechanism 204, as long as electron beams are emitted from the electron gun, leaked beams are continuously generated. Then, according to the first embodiment, the excitation light source 201 which can rapidly respond to ON/OFF, and the photoemissive surface 218 which emits a photoelectron responsive to an incident excitation light are used instead of the electron gun.

The control circuit 160 interconnects, for each shot of the multiple photoelectron beams 20, the timing of switching an excitation light between emission and non-emission with the timing of switching each beam between ON and OFF. Specifically, as shown in FIG. 1, the pulse drive circuit 112 which drives the excitation light source 201, and the BAA drive circuit 113 which controls the blanking aperture array mechanism 204 are interconnected. At least one control circuit of the pulse drive circuit 112, the BAA drive circuit 113, and the total control circuit 161, which configure the control circuit 160, provides a control to interconnect the pulse drive circuit 112 with the BAA drive circuit 113. For example, the total control circuit 161 provides a control to interconnect the pulse drive circuit 112 with the BAA drive circuit 113. Alternatively, the pulse drive circuit 112 may provide a control to interconnect itself with the BAA drive circuit 113. Alternatively, the BAA drive circuit 113 may provide a control to interconnect itself with the pulse drive circuit 112. What may be needed is to install a synchronous circuit which includes an oscillator to generate a clock signal for synchronization in any one of the pulse drive circuit 112, the BAA drive circuit 113, and the total control circuit 161. Specific contents of controlling are described below.

Figure 7:
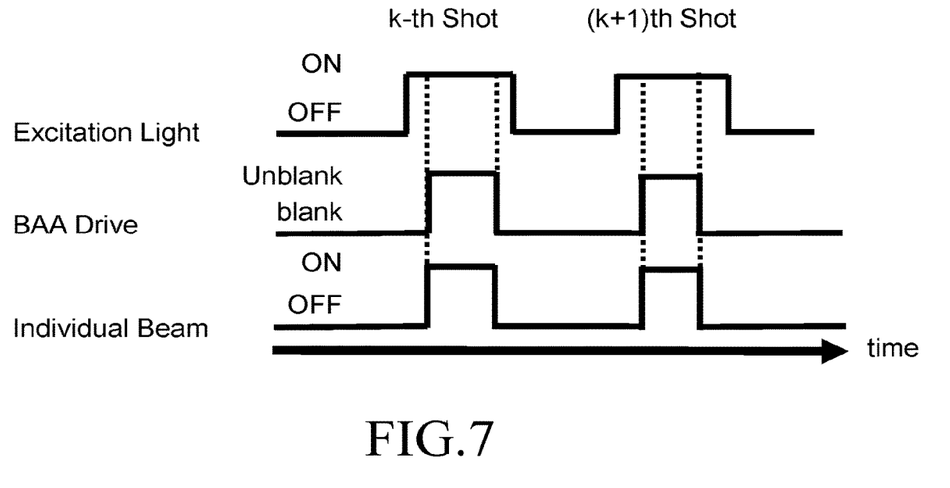
FIG. 7 is a time chart, showing an example of a timing of switching an excitation light between emission and non-emission, and a timing of switching a beam between ON and OFF, according to the first embodiment.

FIG. 7 is a time chart, according to the first embodiment, showing an example of a timing of switching an excitation light between emission and non-emission, and a timing of switching a beam between ON and OFF. FIG. 7 shows a timing chart of ON/OFF indicating emission/non-emission of an excitation light, a timing chart of an ON/OFF drive in individual blanking controlling of a beam in the blanking aperture array mechanism 204, and a timing chart of ON/OFF of a beam associated with an individual blanking control. FIG. 7 shows the k-th shot and the (k+1)-th shot of the multiple photoelectron beams 20.

In FIG. 7, for each shot of the multiple photoelectron beams 20, the control circuit 160 provides a control to switch each beam which is due to be ON to a "beam ON" state from a "beam OFF" state at or after switching the excitation light 200 from a non-emission (OFF) state to an emission (ON) state. Then, the control circuit 160 provides a control to switch the excitation light 200 to a non-emission state from an emission state when or after all the beams have become in the state of "OFF". In the shot cycle of the multiple photoelectron beams 20, as described above, an arbitrary irradiation time within a preset maximum irradiation time Ttr is set for each beam.

The excitation light source 201 starts emitting (generating) the excitation light 200 at a shot cycle start timing. The individual blanking control mechanism of each beam in the blanking aperture array mechanism 204 switches each beam which is due to be ON to a "beam ON" state from a "beam OFF" state at or after the time of shot cycle starting. The individual blanking control mechanism of each beam switches a beam to a "beam OFF" state from the "beam ON" state after an irradiation time individually set has passed. Thus, in accordance with operations of the individual blanking control mechanism, each beam is switched from a "beam OFF" state to a "beam ON" state, and after an irradiation time individually set has passed, it is switched from the "beam ON" state to a "beam OFF" state. The excitation light source 201 stops emitting the excitation light 200 after a predetermined time greater than or equal to the maximum irradiation time Ttr has passed since the shot cycle start timing. By this operation, even when a leaked beam through the limiting aperture 206 is generated in any one of the multiple photoelectron beams 20, since no photoelectron is generated in the first place while the excitation light 200 is being stopped, it is possible to avoid generating a leaked beam. For example, if the ON-and-OFF ratio of the excitation light 200 is 1:1, leaked beams can be reduced to 50% or less compared to the case of "always ON".

Figure 8:
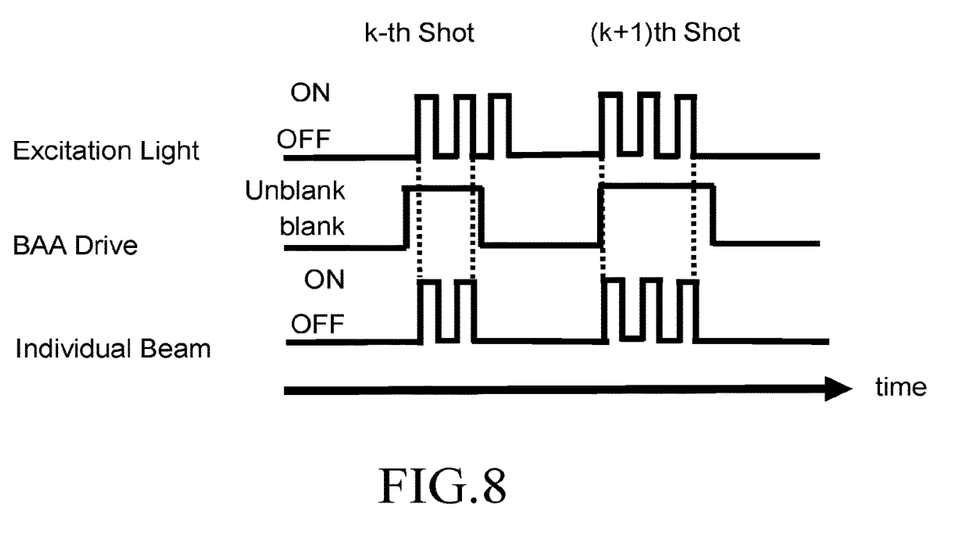
FIG. 8 is a time chart showing an example of a timing of switching an excitation light between emission and non-emission, and a timing of switching a beam between ON and OFF, according to a modified example 1 of the first embodiment.

FIG. 8 is a time chart, according to a modified example 1 of the first embodiment, showing an example of a timing of switching an excitation light between emission and non-emission, and a timing of switching a beam between ON and OFF. FIG. 8 shows, similarly to FIG. 7, a timing chart of ON/OFF indicating emission/non-emission of an excitation light, a timing chart of an ON/OFF drive in individual blanking controlling of a beam in the blanking aperture array mechanism 204, and a timing chart of ON/OFF of a beam associated with an individual blanking control. FIG. 8 shows the k-th shot and the (k+1)-th shot of the multiple photoelectron beams 20.

In FIG. 8, for each shot of the multiple photoelectron beams 20, the control circuit 160 generates a pulse of the excitation light 200 a predetermined number of times after the excitation light 200 has been in a non-emission state. Moreover, for each shot of the multiple photoelectron beams 20, the control circuit 160 provides a control to switch each beam which is due to be ON to a "beam ON" state from a "beam OFF" state at a timing of "pulse OFF" between pulses before, at the same time, or after generation of pulses of the excitation light 200. Then, the control circuit 160 provides a control to switch each beam having been controlled in the "beam ON" state to be in a "beam OFF" state after pulses corresponding to an individually required dose are generated. Each pulse of the excitation light 200 individually comprises a gray scale pulse with a width corresponding to the time for one gray scale level for controlling the dose, and the individually required dose of each beam is controlled using the sum of gray scale pulses. The pulse of the excitation light 200 is generated, for example, at a predetermined timing and a predetermined pitch. The time width and pitch of a pulse is set such that the irradiation time of an individual beam can be controlled. When the maximum irradiation time Ttr is defined by, for example, 1023 gray scale levels of gradation, the emission time of one pulse is defined by, for example, the time for one gray scale level. In such a case, the individual blanking control mechanism of each beam in the blanking aperture array mechanism 204 switches each beam which is due to be ON to a "beam ON" state from a "beam OFF" state at a shot cycle start timing. On the other hand, the excitation light source 201 starts emitting the excitation light 200 at or after the time of shot cycle starting. The individual blanking control mechanism of each beam switches a beam to a "beam OFF" state from the "beam ON" state after pulses corresponding to an irradiation time individually set are generated. The excitation light source 201 is stopped after pulses corresponding to an irradiation time greater than or equal to the maximum irradiation time Ttr are generated.

However, it is not limited to what is described above. The pulse width and pitch of the excitation light 200 may be set variably.

Figure 9:
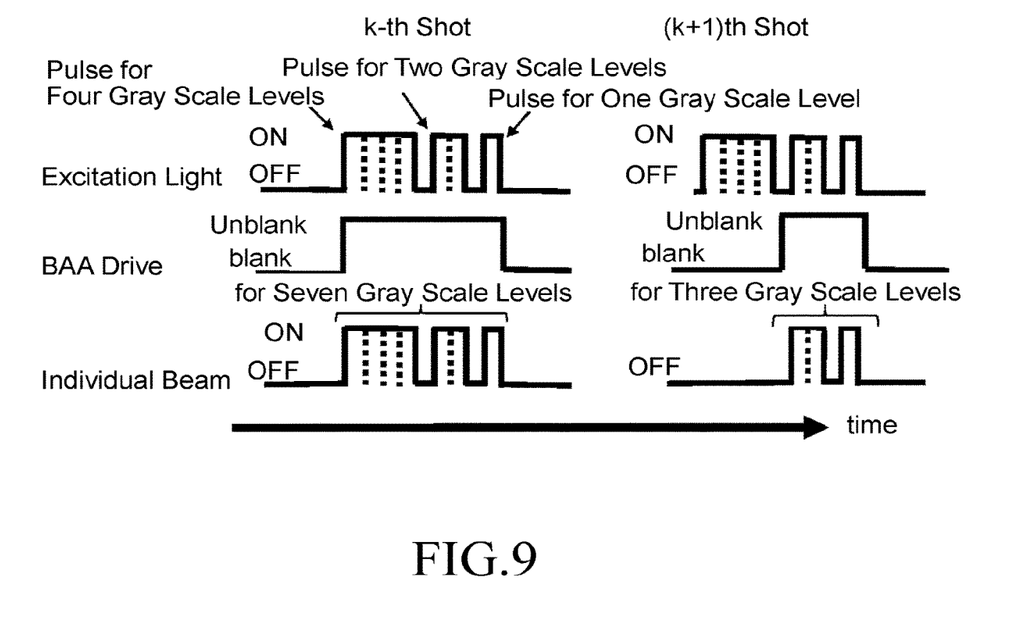
FIG. 9 is a time chart showing another example of a timing of switching an excitation light between emission and non-emission, and a timing of switching a beam between ON and OFF, according to the modified example 1 of the first embodiment.

FIG. 9 is a time chart, according to the modified example 1 of the first embodiment, showing another example of a timing of switching an excitation light between emission and non-emission, and a timing of switching a beam between ON and OFF. In FIG. 9, when the maximum irradiation time Ttr is defined by, for example, 8 gray scale levels, pulses are generated as follows: The time of 1 gray scale level generates one pulse, and the time of 7 gray scale levels generates pulses having time widths of once, twice, and four times the one pulse time width. The time of 0 (zero) gray scale level may be an appropriate timing when the excitation light is stopped, or may be controlled as a pulse having a time width of 0 (zero) times the one pulse time width. In such a case, the individual blanking control mechanism of each beam in the blanking aperture array mechanism 204 provides a control to switch a beam to be a "beam ON" state from a "beam OFF" state at a timing of "pulse OFF" between pulses after starting generating pulses of the excitation light 200 within a time period for generating pulses of the excitation light 200. Then, the individual blanking control mechanism of each beam provides a control to switch a beam to a "beam OFF" state from the "beam ON" state, at the timing of having received pulses corresponding to an individually required dose. The example of FIG. 9 shows a combination of pulses at each shot, and a timing of switching between ON and OFF with respect to a beam shot of irradiation time periods of three gray scale levels and a beam shot of irradiation time periods of seven gray scale levels.

Figure 10:
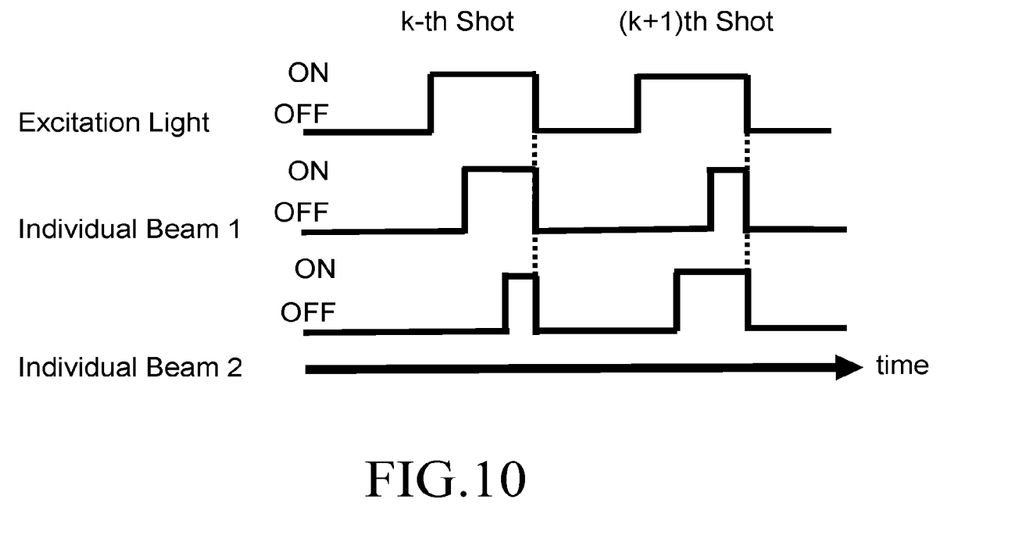
FIG. 10 is a time chart showing another example of a timing of switching an excitation light between emission and non-emission, and a timing of switching a beam between ON and OFF, according to a modified example 2 of the first embodiment.

FIG. 10 is a time chart, according to a modified example 2 of the first embodiment, showing another example of a timing of switching an excitation light between emission and non-emission, and a timing of switching a beam between ON and OFF. FIG. 10 shows the case, in the control contents shown in FIG. 7, where the timing of switching a beam to a "beam OFF" state is in accordance with the timing of stopping the excitation light 200.

In FIG. 10, for each shot of the multiple photoelectron beams 20, the control circuit 160 generates the excitation light 200 during a predetermined period by switching the excitation light 200 to be in an emission state from a non-emission state, and while the excitation light 200 is in the emission state, provides a control to switch each beam which is due to be ON to a "beam ON" state from a "beam OFF" state. Then, the control circuit 160 provides a control to switch the excitation light 200 to be in a non-emission state from the emission state, in synchronization with the timing of switching each beam having been controlled to be ON to a "beam OFF" state from the "beam ON" state. Specifically, the individual blanking control mechanism of each beam in the blanking aperture array mechanism 204 acquires, by an inverse calculation, a start timing of an irradiation time individually set, based on a stop timing of the excitation light 200, and switches, at the acquired start timing, each beam which is due to be ON to a "beam ON" state from a "beam OFF" state. On the other hand, the excitation light source 201 starts emitting the excitation light 200 at the same time as the first start timing to be "beam ON" of each beam, or at the shot cycle start timing which is set before the first start timing to be "beam ON" of each beam. Then, the excitation light source 201 stops emitting (generating) the excitation light 200 after a predetermined time has passed since the shot cycle start timing. The individual blanking control mechanism of each beam switches a beam to be a "beam OFF" state from a "beam ON" state in accordance with the stop timing of the excitation light 200. Therefore, each beam becomes in a state of "beam OFF" at the stop timing of the excitation light 200 in accordance with the operation of the individual blanking control mechanism. In the case of making a beam be OFF by blanking deflection, it may take time for the beam to fall. Because of using a laser oscillator, the excitation light source 201 has a higher switching responsiveness to ON/OFF of the excitation light 200 than that of the individual blanking control mechanism. Therefore, it is possible not to generate leaked beams of during a beam fall by synchronizing the stop timing of the excitation light 200 with the beam OFF timing.

Figure 11:
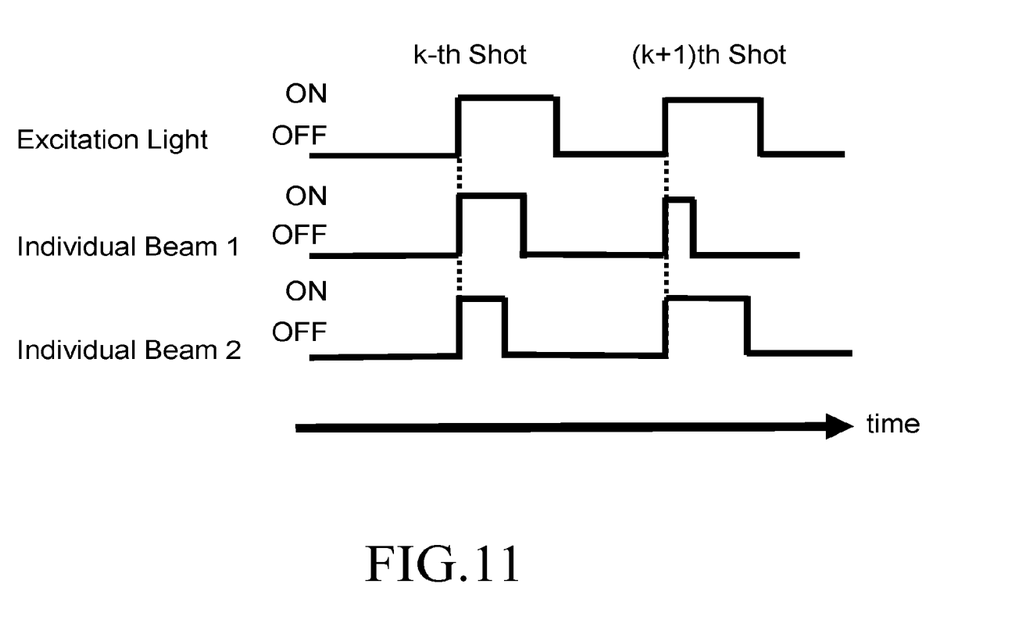
FIG. 11 is a time chart showing another example of a timing of switching an excitation light between emission and non-emission, and a timing of switching a beam between ON and OFF, according to a modified example 3 of the first embodiment.

FIG. 11 is a time chart, according to a modified example 3 of the first embodiment, showing another example of a timing of switching an excitation light between emission and non-emission, and a timing of switching a beam between ON and OFF. FIG. 11 shows the case, in the control contents shown in FIG. 7, where the timing of switching to a "beam ON" state (irradiation start timing) is in accordance with the timing of emitting the excitation light 200.

In FIG. 11, for each shot of the multiple photoelectron beams 20, the control circuit 160 provides a control to switch each beam which is due to be ON to a "beam ON" state from a "beam OFF" state, in synchronization with the timing of switching the excitation light 200 from a non-emission state to an emission state. Then, the control circuit 160 provides a control to switch each beam having been controlled to be ON to a "beam OFF" state from the "beam ON" state before switching the excitation light 200 to a non-emission state from the emission state. Specifically, at the start timing of the shot cycle, the individual blanking control mechanism of each beam in the blanking aperture array mechanism 204 switches each beam which is due to be ON to be in a "beam ON" state from a "beam OFF" state. In the case of making a beam be ON by blanking deflection, it may take time for the beam to rise. Because of using a laser oscillator, the excitation light source 201 has a higher switching responsiveness to ON/OFF of the excitation light 200 than that of the individual blanking control mechanism. Therefore, the excitation light source 201 starts emitting the excitation light 200, in accordance with the timing at which a beam rise time has passed since the shot cycle start timing. Therefore, each beam becomes in a "beam ON" state at the timing of starting emission of the excitation light 200. The individual blanking control mechanism of each beam switches a beam to a "beam OFF" state from a "beam ON" state after an irradiation time individually set has passed. The excitation light source 201 stops emitting the excitation light 200 after a predetermined time greater than or equal to the maximum irradiation time Ttr has passed since the shot cycle start timing. Therefore, it is possible not to generate leaked beams of during a beam rise by synchronizing the start timing of emission of the excitation light 200 with the beam ON timing. Moreover, since it is possible to avoid the dose of during the beam rise, the accuracy of the dose amount can be increased.

As described above, according to the first embodiment, for each shot of the multiple photoelectron beams 20, an individual blanking control which individually switches each beam between ON and OFF is performed by deflecting each beam of the multiple photoelectron beams 20, using the blanking aperture array mechanism 204, while interconnecting the timing of switching the excitation light 200 between emission and non-emission with the timing of switching each beam between ON and OFF.

The writing mechanism 150 writes a pattern on the target object 101, using multiple photoelectron beams having been controlled to be "beam ON".

According to the first embodiment, as described above, it is possible in multi-beam writing to reduce leaked beams.

Embodiments have been explained referring to specific examples described above. However, the present invention is not limited to these specific examples.

While the case of inputting a 10-bit control signal for controlling each logic circuit 41 has been described above, the number of bits may be suitably set. For example, a 2-bit (or any one of 3 to 9 bit) control signal may be used. Alternatively, a control signal of 11 bits or more may be used.

While the apparatus configuration, control method, and the like not directly necessary for explaining the present invention are not described, some or all of them can be appropriately selected and used on a case-by-case basis when needed. For example, although description of the configuration of the control system for controlling the writing apparatus 100 is omitted, it should be understood that some or all of the configuration of the control system can be selected and used appropriately when necessary.

In addition, any other multiple charged particle beam writing apparatus and multiple charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam writing apparatus comprising:
an excitation light source configured to emit an excitation light;
a multi-lens array configured to divide the excitation light into a plurality of lights;
a photoemissive surface configured on the multi-lens array to receive the plurality of lights incident through its upper side, and emit multiple photoelectron beams from its back side;
a blanking aperture array mechanism configured to provide, by deflecting each beam of the multiple photoelectron beams, an individual blanking control which individually switches the each beam between ON and OFF;
an electron optical system configured to include an electron lens, and to irradiate, using the electron lens, a target object with the multiple photoelectron beams having been controlled to be beam ON; and
a control circuit configured to interconnect, for each shot of the multiple photoelectron beams, a timing of switching the excitation light between emission and non-emission with a timing of switching the each beam between ON and OFF.

2. The apparatus according to claim 1, wherein, for each shot of the multiple photoelectron beams, the control circuit provides a control to switch each beam which is due to be ON to a beam ON state from a beam OFF state, one of at and after switching the excitation light from a non-emission state to an emission state, and provides a control to switch the excitation light to a non-emission state from the emission state, one of at or after all beams have become in a beam OFF state.

3. The apparatus according to the claim 1, wherein, for each shot of the multiple photoelectron beams, the control circuit generates pulses of the excitation light a predetermined number of times after the excitation light has been in a non-emission state, switches each beam which is to be ON to a beam ON state from a beam OFF state, and after generating the pulses corresponding to an individually required dose, switches the each beam having been controlled to be ON to a beam OFF state from the beam ON state.

4. The apparatus according to the claim 3, wherein, for the each shot of the multiple photoelectron beams, the control circuit generates the pulses of the excitation light the predetermined number of times after the excitation light has been in a non-emission state, where each pulse of the excitation light individually comprises a gray scale pulse with a width corresponding to a time for one gray scale level for controlling a dose, and the individually required dose of the each beam is controlled using a sum of the gray scale pulse.

5. The apparatus according to the claim 1, wherein, for each shot of the multiple photoelectron beams, the control circuit generates the excitation light during a predetermined period by switching the excitation light to be in an emission state from a non-emission state, provides a control to switch each beam which is due to be ON to a beam ON state from a beam OFF state while the excitation light is in the emission state, and provides a control to switch the each beam having been controlled to be ON to a beam OFF state from the beam ON state in synchronization with a timing of switching the excitation light to be in a non-emission state from the emission state.

6. The apparatus according to the claim 1, wherein, for each shot of the multiple photoelectron beams, the control circuit provides a control to switch each beam which is due to be ON to a beam ON state from a beam OFF state in synchronization with a timing of switching the excitation light from a non-emission state to an emission state, and provides a control to switch the each beam having been controlled to be ON to a beam OFF state from the beam ON state before switching the excitation light to a non-emission state from the emission state.

7. A multiple electron beam writing method comprising:
  emitting an excitation light from an excitation light source;
  dividing the excitation light into a plurality of lights by using a multi-lens array;
  receiving the plurality of lights incident through an upper side of a photoemissive surface, and emitting multiple photoelectron beams from its back side;
  providing, for each shot of the multiple photoelectron beams, an individual blanking control which individually switches each beam of the multiple photoelectron beams between ON and OFF using a blanking aperture array mechanism while interconnecting a timing of switching the excitation light between emission and non-emission with a timing of switching the each beam between ON and OFF; and
  writing a pattern on a target object, using the multiple photoelectron beams having been controlled to be ON.

8. The method according to the claim 7, wherein, for each shot of the multiple photoelectron beams, each beam due to be ON is switched to a beam ON state from a beam OFF state, one of at and after switching the excitation light from a non-emission state to an emission state, and the excitation light is switched to a non-emission state from the emission state, one of at or after all beams have become in a beam OFF state.

9. The method according to the claim 7, wherein, for each shot of the multiple photoelectron beams, pulses of the excitation light are generated a predetermined number of times after the excitation light has been in a non-emission state, each beam due to be ON is switched to a beam ON state from a beam OFF state, and after the pulses corresponding to an individually required dose are generated, the each beam having been controlled to be ON is switched to a beam OFF state from the beam ON state.

10. The method according to the claim 7, wherein, for each shot of the multiple photoelectron beams, the excitation light is generated during a predetermined period by switching the excitation light to be in an emission state from a non-emission state, each beam due to be ON is switched to a beam ON state from a beam OFF state while the excitation light is in the emission state, and the each beam having been controlled to be ON is switched to a beam OFF state from the beam ON state in synchronization with a timing of switching the excitation light to be in a non-emission state from the emission state.

11. The method according to the claim 7, wherein, for each shot of the multiple photoelectron beams, each beam due to be ON is switched to a beam ON state from a beam OFF state in synchronization with a timing of switching the excitation light from a non-emission state to an emission state, and the each beam having been controlled to be ON is switched to a beam OFF state from the beam ON state before switching the excitation light to a non-emission state from the emission state.

* * * * *